United States Patent [19]  
Seki

[11] Patent Number: 4,961,817  
[45] Date of Patent: Oct. 9, 1990

[54] THIN-FILM RELEASING APPARATUS  
[75] Inventor: Mitsuhiro Seki, Tokyo, Japan  
[73] Assignee: Somar Corporation, Tokyo, Japan  
[21] Appl. No.: 283,774  
[22] Filed: Dec. 13, 1988  
[30] Foreign Application Priority Data  
Dec. 14, 1987 [JP] Japan .................................. 62-315552  
[51] Int. Cl.⁵ ........................................... B32B 31/18  
[52] U.S. Cl. .................................... 156/584; 156/344  
[58] Field of Search ................................ 156/344, 584  
[56] References Cited  
U.S. PATENT DOCUMENTS  
3,996,127  12/1976  Rautimo et al. .................. 156/584 X  
4,724,032   2/1988  Kay ...................................... 156/344

Primary Examiner—Robert A. Dawson  
Attorney, Agent, or Firm—Sughrue, Mion, Zinn, Macpeak & Seas

[57] ABSTRACT

A thin-film releasing apparatus in which a portion of a thin-film is released from a surface of a substrate on which the thin film is stuck, the remaining portion of the thin film is then released starting from the released portion thereof and the thus released thin film is then removed. The apparatus comprises a first thin film conveyange system for releasing the remaining portion of the thin film from the thin film by nipping the thin film at the intitially released portion thereof and for conveying the thus released thin film upwardly from the surface of the substrate simultaneously, and a second thin-film conveyance system for mounting thereon the thin film conveyed by the first thin film conveyance system and for conveying the mounted thin film in a direction intersecting a conveyance direction of the substrate.

12 Claims, 9 Drawing Sheets

THIN-FILM RELEASING APPARATUS

BACKGROUND OF THE INVENTION

1. Field of the Invention

The present invention relates to a technique which is effective when applied to a thin-film releasing technique for releasing a thin film stuck on a substrate and for drawing off the released thin film.

2. Background of the Prior Art

Generally, printed-wiring substrates used in electronic appliances, such as computers and the like, are provided by forming patterned wirings of copper or the like on opposite sides (or one side) of an insulating substrate.

Printed-wiring substrates of this type can be produced by the following manufacturing process. First, a lamination composed of a light-sensitive resin (photoresist) layer and a transmission resin cover film (hereinafter simply referred to as a "cover film") for protecting the light-sensitive resin layer is laminated onto an electrically conductive layer of an insulating substrate by thermocompression. After thermocompression lamination, a wiring pattern film is overlapped on the substrate so that the light-sensitive resin layer is exposed to light for a predetermined period of time through the wiring pattern film and the cover film. After the cover film is released from the substrate, the exposed light-sensitive resin layer is developed to form an etching mask pattern. After development, the unnecessary portion of the electrically conductive layer is removed by etching and then the residual part of the light-sensitive resin layer is removed, so that a printed-wiring substrate having a predetermined wiring pattern is prepared.

In the aforementioned process of manufacturing printed-wiring substrates, a step of releasing the cover film is necessary when the exposed light-sensitive resin layer is developed. The releasing of the cover film has depended on human workmanship. Since the cover film is very thin, it requires dexterous fingers and a great deal of skill to prevent damage and destruction of the light-sensitive resin layer due to distortion of releasing stress.

To eliminate overcome these disadvantages, an automatic thin-film releasing apparatus for performing the thin-film releasing process mechanically and automatically has been developed. The automatic thin-film releasing apparatus is provided to release an upper-side cover film automatically by blowing fluid against a loose portion of the cover film which portion is loosened by loosening means, such as a needle, a brush, a knurling tool or the like. The released portion of the cover film released by blowing fluid is attached on a releasing-direction setting plate to be kept thereon, and then the partially released cover film stuck on the substrate is conveyed while being completely released from the substrate by a thin-film conveyance system. The thin-film conveyance system is constituted by two belt conveyers capable of nipping the cover film for releasing and conveying the cover film from the substrate. The thin film conveyance system is connected to the automatic thin-film releasing apparatus or installed within the latter. The cover film conveyed by the belt conveyers of the thin-film conveyance system is conveyed to an exhausted thin-film receiving vessel.

An automatic thin-film releasing apparatus as disclosed in Japanese Patent Application No. 61-388880 (1986) previously filed by the same Applicant of this application has two exhausted thin-film receiving vessels arranged in upper and lower sides of the conveyance path of the substrate. The lower-side cover film on the lower surface of the substrate is conveyed into the lower-side exhausted thin-film receiving vessel. The upper-side cover film on the upper surface of the substrate is conveyed into the upper-side exhausted thin-film receiving vessel. In the thus arranged automatic thin-film releasing apparatus, the exhausted thin-film receiving vessels can be arranged in three dimensions to make it possible to realized miniaturization of the apparatus.

The upper-side cover film on the upper surface of the substrate is conveyed to the upper-side receiver portion of the upper-side exhausted thin-film receiving vessel by the belt conveyers of the thin-film conveyance system, whereafter the cover filmm is exhausted. The belt conveyers are operated while nipping the cover film. Accordingly, the belt conveyers must be long corresponding to the height of the upper-side exhausted thin-film receiving vessel. Therefore, fine distortion of tension is often produced between the belts opposite to each other with respect to the cover film. As a result, a problem arises in that the belt-conveyers often experience problems such as jamming or the like.

Further, the upper-side exhausted thin-film receiving vessel must be arranged in a position higher than the conveyance path of the substrate. Accordingly, handling of the upper-side exhausted thin-film receiving vessel is troublesome in areas, such as disposal of waste cover films. As a result, the ability to work on the receiving vessel is reduced. Particularly, in the case where the exhausted thin-film receiving vessel is formed of a metal material, such as stainless steel or the like, the workability is remarkably lowered due to the excessive weight of the exhausted thin-film receiving vessel.

It is therefore an object of the present invention to provide a technique by which conveyance problems of the released thin film can be reduced in a thin-film releasing apparatus in which the thin film stuck to the substrate is conveyed and exhausted while the thin film is simultaneously released from the substrate.

It is another object of the invention to provide a technique by which conveyance problems of the thin film caused by the occurrence of electrostatic energy can be reduced as well as the aforementioned object attained.

It is a further object of the invention to provide a technique by which the yield of products can be improved.

It is also an object of the invention to provide a technique by which handling of the exhausted thin-film receiving vessel can be improved and conveyance difficulties of the released thin film can be reduced in a thin-film releasing apparatus in which the thin film stuck to the substrate is conveyed so as to be exhausted into the exhausted thin-film receiving vessel while the thin film is released from the substrate.

It is also a further object of the invention to provide a technique by which handling of the exhausted thin-film receiving vessel can be improved and conveyance troubles of the released thin film can be reduced, and by which miniaturization of the apparatus can be attained, in a thin-film releasing apparatus in which the thin films stuck to opposite sides of the substrate are conveyed to be exhausted to the exhausted thin-film receiving vessel while the thin films are released from the substrate.

The foregoing and other objects and features of the invention will be apparent from a reading of the specification and the accompanying drawings.

SUMMARY OF THE INVENTION

A brief description of typical aspects of the invention disclosed in the specification are as follows.

The thin-film releasing apparatus in which a portion of a thin film is released from a surface of a substrate on which the thin film is stuck, the remaining portion of the thin film is then released starting from the released portion thereof, and the thus released thin film is then drawn off, according to a first aspect of the present invention, is characterized in that the apparatus comprises a first thin-film conveyance system for releasing the entire thin film from the substrate by nipping the thin film at the initially released portion thereof and for conveying the completely released thin film upward from the surface of the substrate while nipping the thin film, and a second thin-film conveyance system for mounting thereon the thin-film conveyed by the first thin-film conveyance system and for conveying the mounted thin film in a direction intersecting a conveyance direction of the substrate.

The thin-film releasing apparatus, according to a second aspect of the present invention, is characterized in that the apparatus further comprises, in addition to the constituent components of the above apparatus, a second thin-film conveyance system having an electrically convductive belt for mounting thereon the thin film conveyed by the first thin-film conveyance system and for conveying the mounted thin film in a direction intersecting the conveyance direction of the substrate. The thin film releasing apparatus, according to a third aspect of the present invention, is characterized in that the second thin-film conveyance system is provided at the upper side of the substrate conveyance path in a stage preceding the position on releasing the thin film. According to a fourth aspect of the invention the released thin film is conveyed to exhausted thin-film receiving vessel which is provided at a side of the substrate conveyance path so as to receive the thin film conveyed by the second thin-film conveyance system.

According to another embodiment of the invention, a thin-film releasing apparatus in which portions of the fist and second thin films stuck on opposite surfaces of a substrate are released from the surfaces, the remaining portion of the first and second thin films are then released starting from the released portions thereof, and the thus released first and second thin films are then drawn off into exhausted thin-film receiving vessels, characterized in that the apparatus comprises a first thin-film conveyance system for releasing the remaining portion of the first thin film by nipping the first thin film at the initially released portion thereof and for conveying the completely released first thin film upward from an upper one of the opposite surface of the substrate while nipping the first thin-film, a second thin-film conveyance system for mounting thereon the first thin film conveyed by the first thin film conveyance system and for conveying the mounted first thin film in a direction intersecting a conveyance direction of the substrate, a first one of the exhausted thin-film receiving vessels being provided at a side of the substrate conveyance path so as to receive the first thin film conveyed by the second thin film conveyance system, a third thin-film conveyance system for releasing the remaining portion of the second thin film by nipping the second thin film at the initially released portion thereof and for conveying the thus released second thin film downward from a lower one of the opposite surfaces of the substrate while nipping the second thin film, and a second one of the exhausted thin-film receiving vessels provided for receiving the second thin film conveyed by the third thin-film conveyance system, the second exhausted thin-film receiving vessel being provided integrally with the first ehausted thin-film receiving vessel at a portion below the substrate conveyance path.

The above-described device avoids conveyance problems such as jamming in the exhaust path of the thin film because the length for conveyance of the nipped thin film (the length of the first thin-film conveyance system) can be shortened by a degree corresponding to the second thin-film conveyance system. In addition, conveyance problems of the thin film caused by the occurrencee of the electrostatic energy can be reduced in the conveyance path of the thin film because the energy produced during releasing of the thin film from the substrate and during conveyance of the thin film by the first thin-film conveyance system can be discharged through the electrically conductive belt. Further, the yield of products in substrate manufacturing process can be improved because impurities attached on the released thin film and impurities from the second thin-film conveyance system can be prevented from attaching on the surface of the substrate after the thin film has been released therefrom. Furthermore, maintenance of the exhausted thin-film receiving vessel can be improved in areas such as disposed of waste thin films and the like, because the exhausted thin-film receiving vessel can be arranged at a relatively lower position on a side of the conveyance path of the substrate. Finally, miniaturization of the thin-film releasing appartus can be attained because of the size of exhausted thin-film receiving vessel can be reduced.

DESCRIPTION OF THE PREFERRED EMBODIMENT

An embodiment of the present invention which is applied to an apparatus for releasing cover film (protective film) of a printed-wiring substrate will be described with reference to the drawings, in which parts having the same function are referenced correspondingly in all the drawings.

Figure 1:
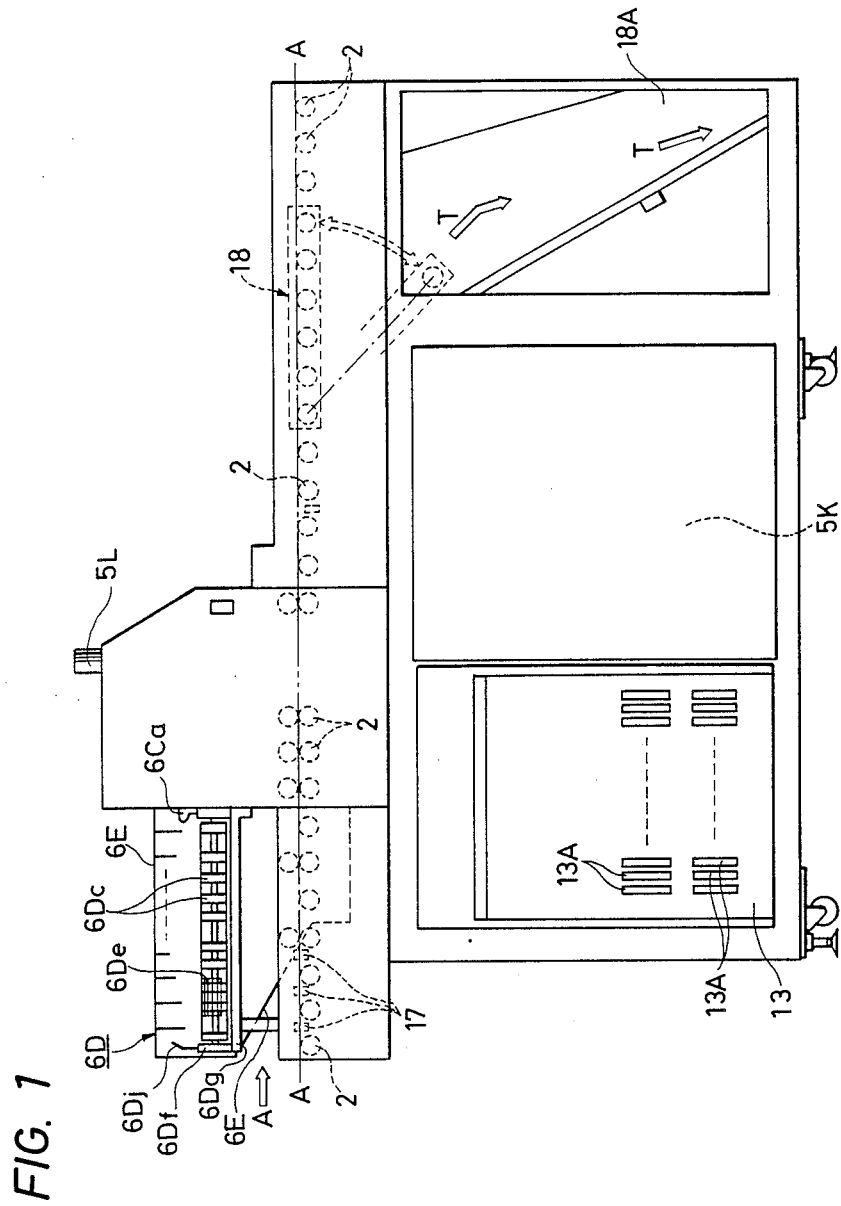
FIG. 1 is a side view schematically showing the arrangement of an apparatus for releasing protective-film of a printed-wiring substrate as an embodiment of the present invention.
Figure 2:
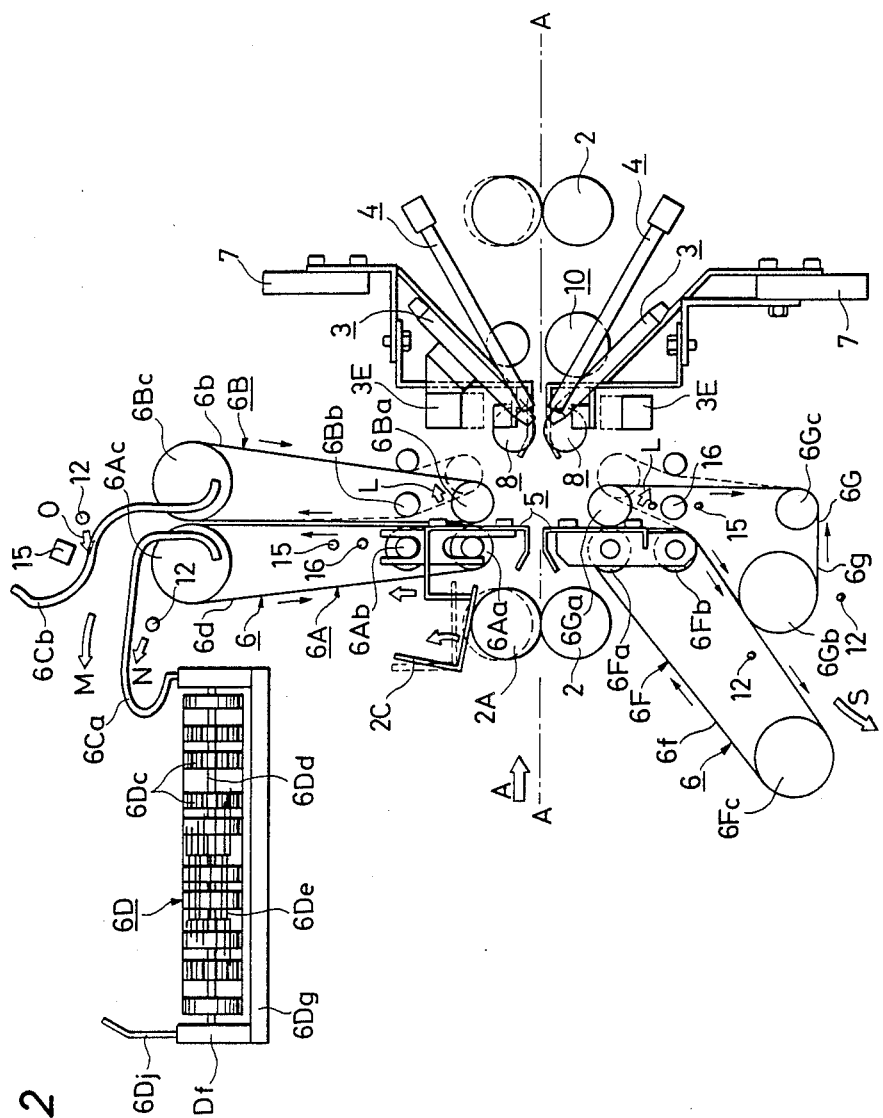
FIG. 2 is an enlarged side view of a main part of FIG. 1.

FIG. 1 is a schematic side view of an apparatus for releasing cover film of a printed-wiring substrate as an embodiment of the present invention, and FIG. 2 is a partly enlarged side view showing a portion of the cover film from which the cover film is released.

As shown in FIGS. 1 and 2, a conveyor device for conveying the printed-wiring substrate in the cover film releasing apparatus driving rollers 2 for conveying the printed-wiring substrate 1. As shown in FIG. 2, a thin-film loosening unit 3, a fluid spraying unit 4, a releasing-direction setting plate (releasing auxiliary plate) 5, and a thin-film conveying (thin-film exhausting unit) 6 are provided on the substrate conveyance path A—A.

Figure 5:
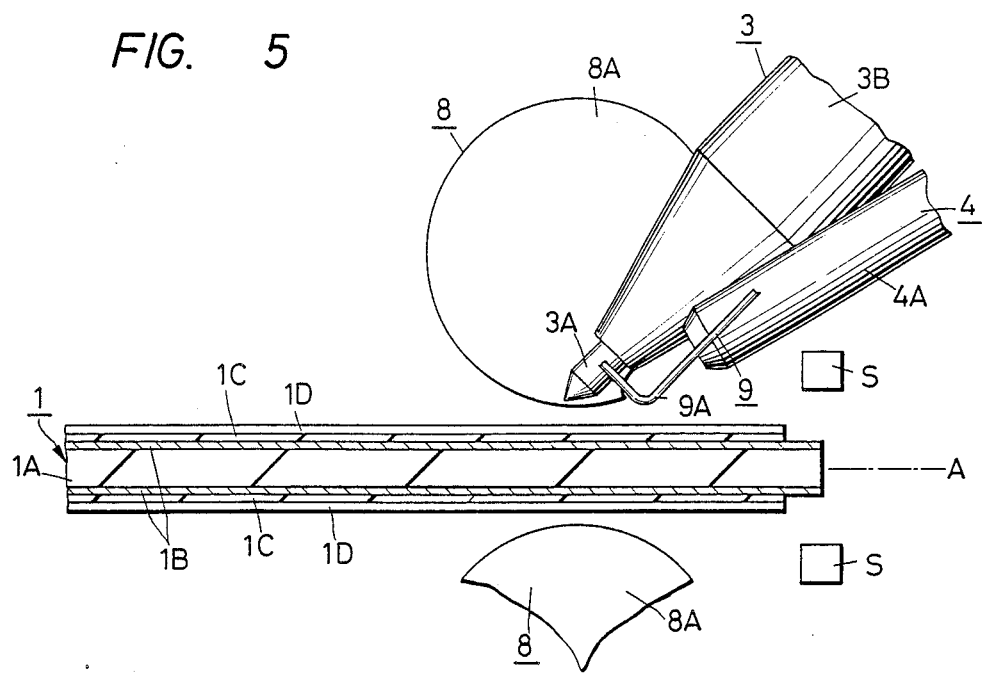
FIGS. 5 through 9 are enlarged sectional views for showing steps of the releasing operation in the protective-film releasing apparatus.

As shown in FIG. 5, (a partly enlarged sectional view through FIG. 2), the printed-wiring substrate 1 comprises an electrically insulating substrate 1A, and at least one electrically conductive layer 1B provided on one or two sides of the insulating substrate 1A, for example, the conductive layer 1B being formed of copper. A lamination which comprises a photosensitive resin layer (photoresist layer) 1C and cover film (a protective thin film) 1D, is laminated on the conductive layer 1B of the printed-wiring substrate 1 by thermocompression. The photosensitive resin layer 1C is provided after exposure to light with masked by overlapping a plurality of wiring pattern films having predetermined wiring patterns. The printed-wiring substrate 1 is arranged to be conveyed through the driving rollers 2 in the direction of the arrow A shown in FIGS. 1 and 2.

Figure 3:
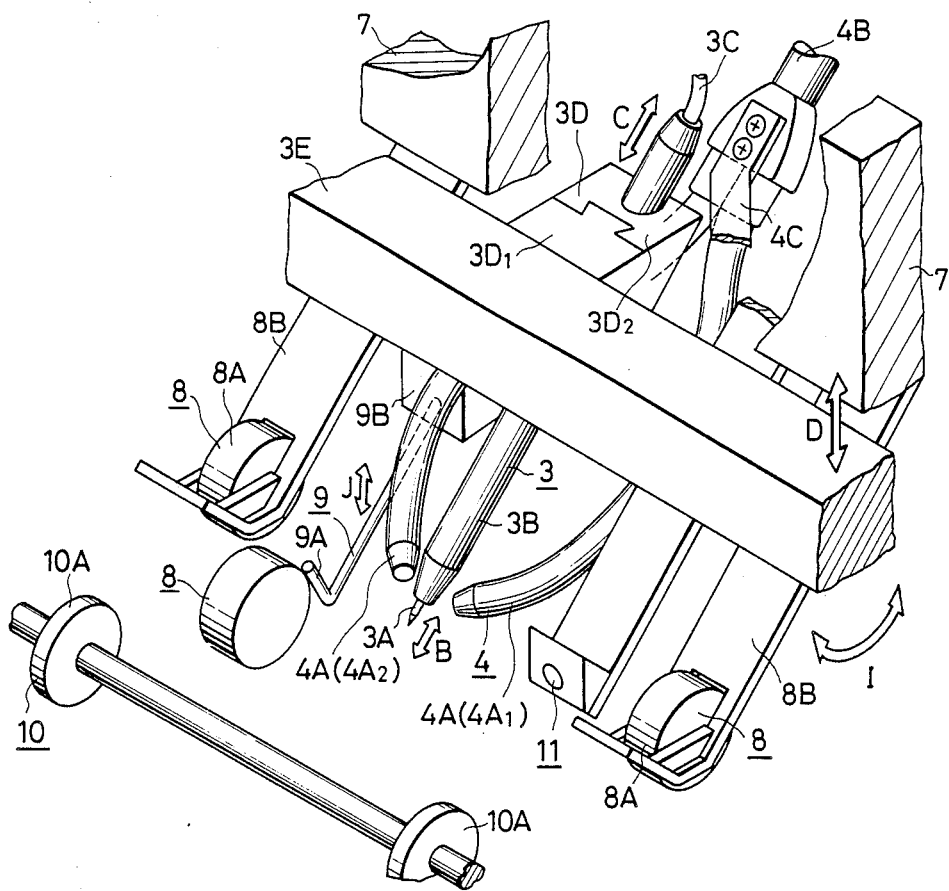
FIG. 3 is an enlarged perspective view of a main part of FIG. 2.
Figure 4:
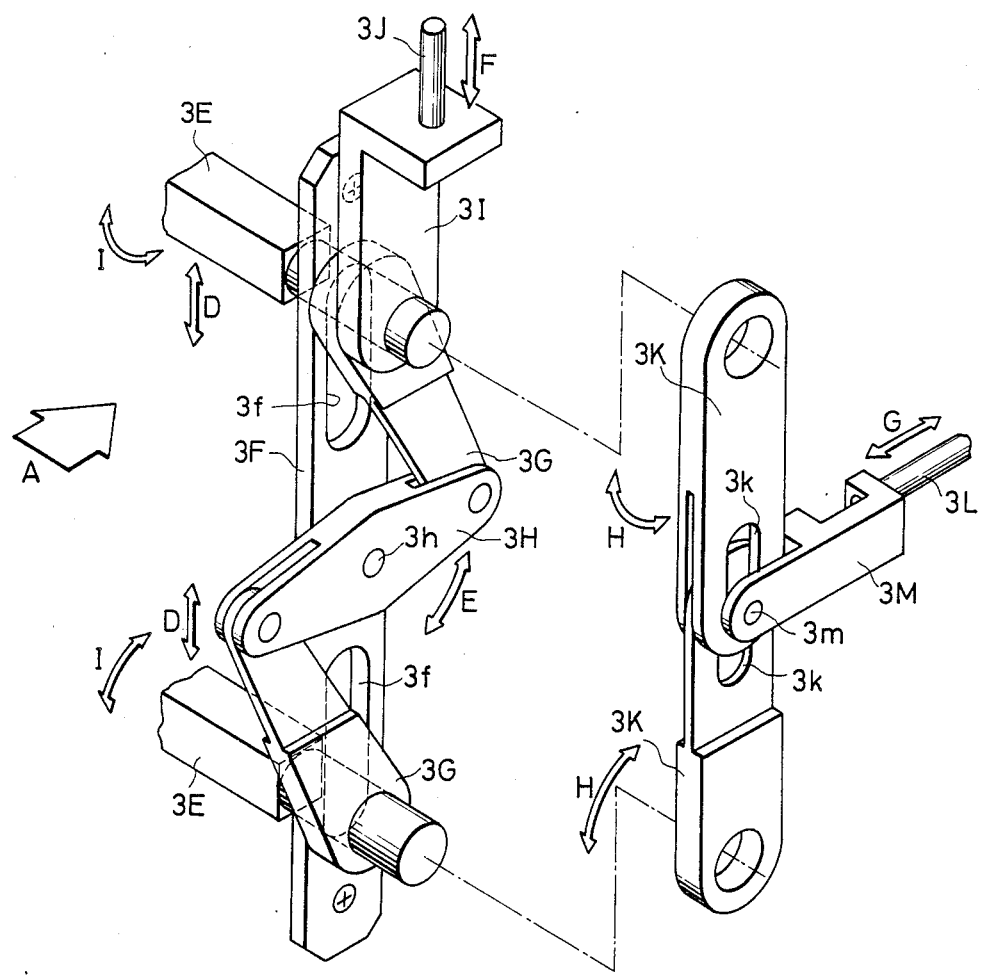
FIG. 4 is an enlarged exploded perspective view of FIG. 1.

The thin-film loosening unit 3 is arranged as shown in FIGS. 2 and 3 (partly perspective view) and FIG. 4 (an enlarged exploded perspective view).

The thin-film loosening unit 3 has at least one loosening member 3A provided at each of the opposite sides of the printed-wiring substrate 1. As shown in FIG. 3, the loosening member 3A is formed like a needle at the printed-wiring substrate 1 side. The loosening member 3A is vibrated in the directions of arrow B by the a pneumatic vibrator 3B. The pneumatic vibratory equipment 3B (not shown in detail) receives compressed air from a fluid feeder pipe 3C, so that, for example, vibration of 200–300 strokes per minute is given to the loosening member 3A.

The top end of the loosening member 3A is formed so that vibratory pressure is applied to the end portion of the lamination composed of the photosensitive resin layer 1C and the cover film 1D. That is, the end portion of the lamination is energized. When the end portion of the lamination is energized, the cover film 1D is loosened from the photosensitive resin layer 1C. Because the adhesive power between the photosensitive resin layer 1C and the conductive layer 1B is stronger than that between the photosensitive resin layer 1C and the cover film 1D, the photosensitive resin layer 1C and the conductive layer 1B are not separated from each other at the end portion of the energized lamination.

For example, the loosening member 3A has a top angle ranging from approximately 60 to 70 degrees. The top end of the loosening member 3A has a moderate radius of curvature so as not to damage the conductive layer 1B and the lamination (mainly, the photosensitive resin layer 1C) of the printed-wiring substrate 1. The loosening member 3A is formed of a metal material, such as stainless steel, carbon steel, or the like, or a non-metal material, such as ceramics or the like, so that abrasion of the top end can be sufficiently reduce.

The pneumatic vibrator 3B connected to the loosening member 3A arranged on opposite sides of the substrate conveyance path A—A are supported by loosening member supporting rotary shafts 3E through holders 3D, respectively. Each of the holders 3D is constituted by a stationary holder portion $3D_1$ and a movable holder portion $3D_2$. The stationary holder portion $3D_1$ is fixed to the loosening member supporting rotary shaft 3E. The movable holder portion $3D_2$ is arranged to hold the loosening member 3A and the pneumatic vibratory equipment 3B at a predetermined angle with respect to the substrate conveyance path A—A. The movable holder portion $3D_2$ is arranged to be slidable in the directions of the arrow C relative to the stationary holder portion $3D_2$ (or loosening member supporting rotary shaft 3E) so that the loosening member 3A with a predetermined amount of vibratory pressure can be brought into contact with the lamination. The motion of the movable holder portion $3D_2$ in the directions of the arrow C is, for example, controlled by an elastic member, such as a spring or the like (not shown).

The one end portion (or opposite end portions) of the loosening member supporting rotary shaft 3E is rotatably connected to one end of a movable arm member 30 through a guide slot 3f of a guide member 3F as shown in FIG. 4. The guide member 3F is fixed to the releasing apparatus body 7 by a mounting means, such as machine screws or the like (not shown). The guide slot 3f is provided to guide the loosening member supporting rotary shaft 3E and the loosening member 3A in the directions of the arrow D to thereby move close to or far from the printed-wiring substrate 1.

The other end portions of the upper and lower movable arm members 3G are respectively rotatably mounted to end portions of a rotary arm member 3H which are arranged opposite to each other with respect to a rotary shaft 3h, so that the rotary arm member 3H is rotatable around the rotary shaft 3h in the directions of the arrow E. The rotary arm member 3H is provided to move the upper and lower movable arm members 3G in the different directions of the arrow D. The one end portion of the upper (or lower) loosening member supporting rotary shaft 3E is connected, through a connection arm member 3I, to a shaft 3J which serves as a driving source for two sides of the printed-wiring substrate.

The guide members 3F for guiding the loosening member supporting rotary shaft 3E, the movable arm members 3G, the rotary arm member 3H, and the double-side driving source constitute a link mechanism of the thin-film loosening unit 3. The loosening members 3A arranged opposite to each other with respect to the printed-wiring substrate 1 are movable close to each other or away form each other by operating the shaft 3J in the directions of the arrow F. The constituent members of the link mechanism are formed of a material, such as iron, aluminum alloy, hard resin or the like, which is relatively durable against external force. Examples of the double-side driving source herein used include a pneumatic cylinder, a hydraulic cylinder, an electromagnetic solenoid and the like. Although this embodiment includes the case where the shaft 3J is connected to the one end portion of the movable arm member 3G, it is a matter of course that the invention is not limited to the specific embodiment and that the shaft 3J may be directly connected to one end portion of the rotary arm member 3H.

The loosening members are linked to the double-side driving source by use of the aforementioned link mechanism, so that the loosening members 3A arranged opposite to each other with respect to the printed-wiring substrate 1 can be brought into contact with the opposite sides of the printed-wiring substrate 1 or can be moved far away therefrom (that is, the loosening members 3A are movable in the directions of the arrow D). With the above described link mechanism, two driving sources are not required for driving the loosening members 3A. Rather, the loosening members 3A arranged opposite to each other with respect to the printed-wiring substrate 1 can be simultaneously driven by one double-side driving source.

Because the constituent members of the link mechanism, that is, the guide member 3F, the guide arm members 3G and the rotary arm member 3H are substantially stiff, and because the operations of these members are limited by the guide slots $3f$ and the rotary shaft $3h$, the loosening members 3A arranged opposite to each other with respect to the printed-wiring substrate 1 can be controlled so exactly that they are equal to each other in operational quantity and operational time.

Because the aforementioned link mechanism has a relatively smaller number of parts compared with the conventional link mechanism, such as a rack-and-pinion mechanism or a gearing mechanism, and because the constituent members of this link mechanism are simple in form, the link mechanism for linking the loosening members 3A to the double-side driving source can be simplified in construction.

The respective one end portions (or opposite ends portions) of the loosening member supporting rotary shafts 3E arranged opposite to each other with respect to the movable arm member 3G are connected to the respective one end portions of loosening member rotating arm members 3K. Slots $3k$ are provided in the other end portions of the upper and lower, loosening member rotating arm member 3K, respectively, so that a shaft portion $3m$ of a connection arm member 3M connected to a shaft 3L for the double-side driving source is inserted into the slots $3k$. In short, the loosening member rotating arm members 3K are linked through the connection arm member 3M to the shaft 3L for the double-side driving source. For example, the same mechanism, such as a pneumatic cylinder or the like, as employed in the aforementioned link mechanism, may be used as the double-side driving source.

The loosening member rotating arm members 3K, the connection arm member 3M and the double-side driving source constitute a loosening member rotating mechanism of the thin-film loosening unit 3. The loosening member rotating arm members 3K are rotated in the directions of the arrow H by operating the shaft 3L in the directions of the arrow G, and the loosening member supporting rotary shafts 3E are rotated in the directions of the arrow I by operating the shaft 3L in the directions of the arrow G. In short, the loosening members 3A are moved by a predetermined distance in the direction of substrate conveyance while the end portion of the lamination is pressed by vibratory pressure of the loosening members 3A. In this embodiment, the loosening member rotating mechanism is constructed so that the loosening members 3A are moved by about 1-3 mm in the direction of substrate conveyance.

According to the loosening member rotating mechanism which is similar to the aforementioned link mechanism for moving the loosening members close to or far from the printed-wiring substrate 1, not only the loosening members 3A arranged opposite to each other with respect to the printed-wiring substrate 1 can be driven by one driving source, but also the upper and lower loosening members 3A can be controlled exactly in operational quantity and operational time.

Further, according to the loosening member rotating mechanism, the link mechanism for linking the loosening members 3A to the double-side driving source can be simplified in construction.

As described above, the thin-film loosening unit 3 substantially comprises loosening members 3A, a pneumatic vibratory equipment 3B, a link mechanism, and a loosening member rotating mechanism.

Although this embodiment is directed toward the case where the loosening members 3A are operated by the pneumatic vibratory equipment 3B, it is a matter of course that the pneumatic vibratory equipment 3B may be replaced by an electromagnetic vibratory equipment as described in Japanese Patent Application No. 61-181126 (1986) by the same Applicant as this application.

As shown in FIGS. 2 and 3, the fluid spraying unit 4 is constructed so that compressed fluid, for example, gas, such as air, inert gas and the like, or liquid, such as water and the like, is blown out from nozzles 4A. The fluid spraying unit 4 is constructed so that the fluid is blown out directly to a gap between the photosensitive resin layer 1C and the cover film 1D which is loosened from the photosensitive resin layer 1C at the end portion of the printed-wiring substrate 1 by the thin-film loosening unit 3. The fluid spraying unit 4 is constructed so that the nozzles 4A are placed in the vicinity of the loosening members 3A of the thin-film loosening unit 3 in order to spray the gap portion with the liquid instantaneously. The nozzles 4A are arranged in pair ($4A_1$ and $4A_2$) so as to blow out the fluid from the opposite sides (two directions) to the top portion in each of the loosening members 3A of the thin-film loosening unit 3. The pair of nozzles 4A are constructed so that the fluid is supplied from one fluid supply pipe 4B.

The pair of nozzles 4A are fixed to the apparatus body (fixing/supporting members) 7 through supporting members 4C. The mounting of the nozzles 4A is carried out so exactly that the direction of ejection of the fluid is not affected by fine vibration due to the operation of the thin-film releasing apparatus. In other words, the nozzles 4A are constructed so that the direction of blowing-out of the fluid is maintained constant.

Because the fluid is instantaneously ejected into the gap portion between the photosensitive resin layer 1C and the cover film 1D by directing the fluid spraying unit 4 to the gap portion produced by the thin-film loosening unit 3, the cover film 1D can be instantaneously and securely released from the photosensitive resin layer 1C with ease.

Because the pair of nozzles 4A in the fluid spraying unit 4 are provided to eject the fluid from different sides so that the fluid can be securely ejected into the loosened portion of the cover film 1D loosened by the thin-film loosening unit 3, the effect of releasing the cover film 1D due to the ejection of the fluid can be improved.

The present invention may be constructed so that the angle of ejecting the fluid from the nozzles 4A is adjustable. More particularly, the fluid spraying unit 4 is constructed so that, when the fluid ejects, the nozzles 4A are moved as near to the gap portion as possible, and after fluid ejection, the nozzles 4A are moved far away therefrom so as not to be in contact with the printed-wiring substrate 1.

In the vicinity of the aforementioned substrate conveyance path A—A, as shown in FIGS. 3 and 5, substrate securing members 8 and a unit 9 for detecting the end of the lamination are provided. The substrate securing members 8 and the lamination end detecting unit 9 are arranged substantially on one and the same line crossing the substrate conveyance path A—A.

Each of the substrate securing members 8 comprise a roller 8A, and a supporting member 8B for supporting the roller 8A at one end so that the roller can be rotated freely. The other end of the supporting member 8B is mounted to the apparatus body 7 by fixing means, such as a machine screw or the like. The substrate securing member 8 is arranged in an area where the distance between the conveying driving rollers 2 is widened by provision of the thin-film loosening unit 3 and the fluid spraying unit 4. The substrate securing member 8 is arranged in an area where vibratory pressure in the thin-film loosening unit 3 or energy due to compressed fluid in the fluid spraying unit 4 is applied to the printed-wiring substrate 1.

The roller 8A is arranged to have a predetermined distance from the printed-wiring substrate 1 (in practice, the cover film 1D at the surface thereof). In other words, the roller 8A is arranged to have a predetermined distance to keep the printed-wiring substrate 1 in the substrate conveyance path A—A and release the cover film 1D by the fluid spraying unit 4 without interference. The roller 8A is formed of a relatively soft material, such as for example, resin, rubber or the like, particularly to avoid injury or destruction of the photosensitive resin layer 1C in the lamination when the roller 8A is brought into contact with the printed-wiring substrate 1. The supporting member 8B is arranged to support the roller 8A and keep the printed-wiring substrate conveyance path A—A in the same manner discussed above. The supporting member 8B is formed of a relatively hard material, such as hard resin, metal or the like.

By providing the substrate securing members 8 in the vicinity of the loosening members 3A of the thin-film loosening unit 3 and in the vicinity of the substrate conveyance path A—A, the hanging down of the forward top end of the printed-wiring substrate 1 can be prevented, so that the printed-wiring substrate 1 can be securely kept in the substrate conveyance path A—A. In other words, the substrate securing members 8 serve to avoid problems, such as bad conveyance (jam) or the like, during conveyance of the printed-wiring substrate 1 to thereby prevent damage and destruction of the printed-wiring substrate 1 and the thin-film releasing apparatus.

Further, by forming the rollers 8A to have a predetermined distance from the surface of the printed-wiring substrate 1, the cover film 1D can be securely released by the fluid spraying unit 4 without interference of the rollers 8A.

The substrate securing members 8 may be constructed so that the rollers 8A or supporting members 8B have elastically to make it possible to change their positions when brought into contact with a thick printed-wiring substrate 1.

An auxiliary substrate securing member 10 is provided in the vicinity of the substrate conveyance path A—A on the substrate exit side compared with the aforementioned substrate securing members 8. The auxiliary substrate securing member 10 comprises rollers 10A, and a rotary shaft 10B rotatably supporting the rollers 10A and mounted to the apparatus body 7. The auxiliary substrate securing member 10 is arranged to keep the printed-wiring substrate 1 in the substrate conveyance path A—A substantially in the same manner as the aforementioned substrate securing members 8.

The lamination end detecting unit 9 may be of a capacitance type in which the change of capacitance in the printed-wiring substrate 1 is detected, or may be of an electrical resistance type in which the change of electrical resistance in the printed-wiring substrate 1 is detected. The lamination end detecting unit 9 substantially comprise rod-like contactors 9A arranged opposite to each other with respect to the printed-wiring substrate 1, and movable supporting means 9B for supporting the contactors 9A. Each of the rod-like contactors 9A is formed of an electrically conductive material, such as copper, steel or the like. The rod-like contactor 9A is L-shaped so that it can be smoothly brought into contact with the printed-wiring substrate 1. The movable supporting means 9B are fixed to the apparatus body 7. Although detailed illustration is omitted, the movable supporting 9B are arranged to move the rod-like contactors 9A close to or far from the substrate conveyance path A—A (in the directions of the arrow J). for example, the movable supporting means 9B are constituted by an electromagnetic solenoid for moving the rod-like contactors 9A close to the substrate conveyance path A—A, and an elastic member for moving them far away therefrom.

In the following, the operation of loosening the end portion of the lamination of the printed-wiring substrate 1 and the operation of releasing the lamination from the printed-wiring substrate 1 are briefly described with reference to FIGS. 2 through 4 and FIGS. 5 through 9 (partly enlarged sectional views showing releasing steps, respectively).

First, in the substrate conveyance path A—A, the printed-wiring substrate 1 is conveyed in the direction of the arrow A by the conveyance driving rollers 2.

Next, as shown in FIG. 5, when the forward end of the printed-wiring substrate 1 passes through a position where the thin-film loosening unit 3 and the fluid spraying unit 4 are provided, the rotation of the conveyance driving rollers 2 stops so that the conveyance of the printed-wiring substrate 1 stops as well. The stopping of the conveyance is made by a transmission type or reflection type photosensor S which detects the forward end of the printed-wiring substrate 1.

Figure 6:
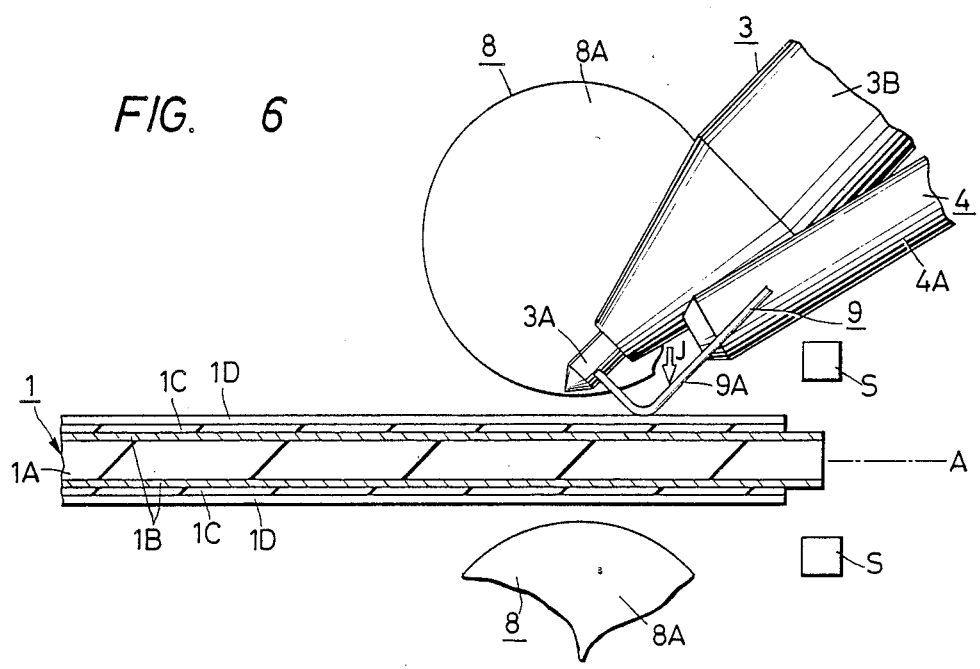
Figure 7:
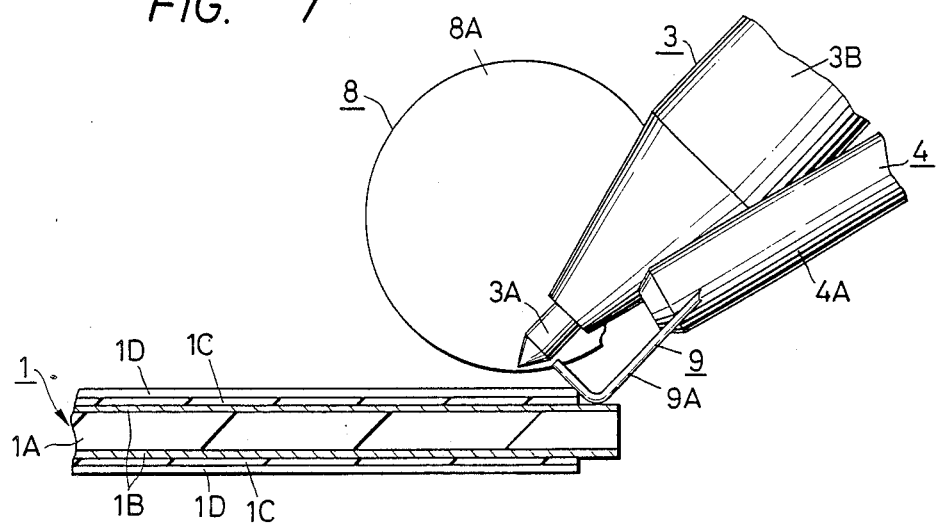

Next, as shown in FIG. 6, the rod-like contactor 9A of the lamination end detecting unit 9 comes into contact with the surface of the lamination (cover film 1D) in the printed-wiring substrate 1. The rod-like contactor 9A is arranged to be movable in the direction of the arrow J by the movable supporting means 9B. The capacitance (or electrical resistance) of the printed-wiring substrate 1 is detected through the operation of the rod-like contactor 9A. The contact between the rod-like contactor 9A and the surface of the lamination may be operated by the detection signal of the photosensor S substantially simultaneously with the stopping of the conveyance of the printed-wiring substrate 1.

Next, while the rod-like contactor 9A is in contact with the surface of the lamination, the printed substrate 1 which has stopped is conveyed in the reverse direction to the substrate conveyance direction. When the rod-like contactor 9A reaches the end portion of the lamination in the forward end of conveyance, capacitance (or electrical resistance) changes so that the end portion of the lamination can be detected.

Figure 8:
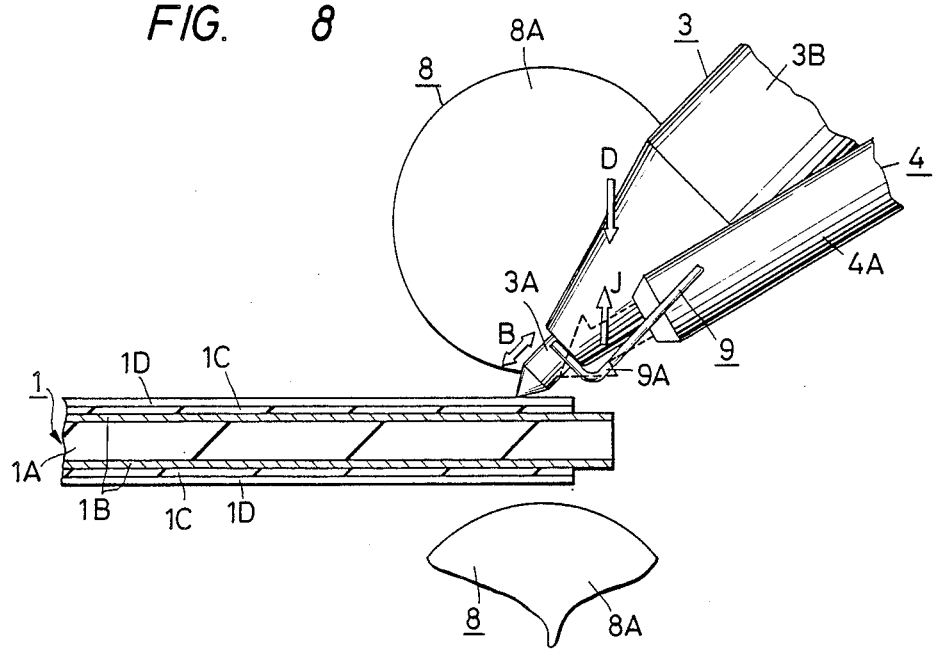

Subsequently, the reverse-direction conveyance of the printed-wiring substrate 1 is stopped by the signal of detection of the end portion of the lamination. Substantially simultaneously with the stopping operation, as shown in FIG. 8, the rod-like contactor 9A is moved away from the substrate conveyance path A—A (in the direction of the arrow J) and, at the same time, the loosening member 3A of the thin-film loosening unit 3 is brought into contact with the surface of the end portion of the lamination while the loosening member 3A is vibrated in the directions of the arrow B. The movement of the loosening member 3A is carried out as follows. The double-side driving source shaft 3J, as shown in FIG. 4, is operated in the directions of the arrow F (the downward direction in FIG. 4) to thereby operated the rotary arm member 3H and the movable arm members 3G to thereby rotate the loosening member supporting rotary shafts 3E in the directions of the arrow D. In short, the movement of the loosening member 3A is caused by the link mechanism. The vibration of the loosening member 3A is produced by the pneumatic vibrator 3B. The fluid is ejected from the top end of the nozzle 4A of the fluid spraying unit 4 simultaneously with the vibratory pressure of the loosening member 3A.

Figure 9:
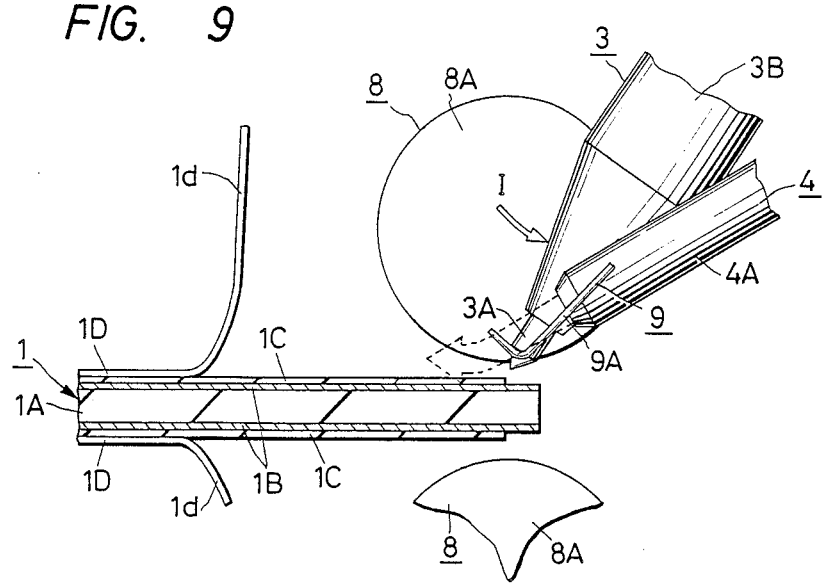

Next, as shown in FIG. 9, the loosening member 3A is finely moved to the substrate conveyance direction A side (in the direction of the arrow I) while the loosening member 3A is vibrated. The movement of the loosening member 3A is carried out as follows. The double-side driving source shaft 3L is operated in the directions of the arrow G (the right direction in FIG. 4) to thereby operate the loosening member rotating mechanism constituted by loosening member rotating arm members 3K and a connection arm member 3M to thereby rotate the loosening member supporting rotary shafts 3E in the directions of the arrow I. As described above, for example, the fine movement of the loosening member 3A is carried out with a stroke of 1–3 mm.

In order to avoid the positional change of the printed-wiring substrate 1 due to the vibratory pressure and movement of the loosening member 3A, the printed-wiring substrate 1 is supported between the conveyance driving rollers 2 and the substrate pinch rollers 2A provided above the driving rollers (see FIG. 2). First, when the forward end of the printed-wiring substrate 1 is detected, a signal is issued so that the driving source (motor) which operates the conveyance driving rollers 2 is stopped. Simultaneously, a pneumatic cylinder, hydraulic cylinder, or the like (not shown) is operated to operated a braking mechanism, so that an L-shaped braking push plate 2C is brought into contact with the substrate push rollers 2A to thereby press the substrate push rollers 2A and fixedly secure the printed-wiring substrate 1.

As described above, the end portion of the lamination composed of a photosensitive resin layer 1C and a cover film 1D in the printed-wiring substrate 1 is pressed by the vibrating loosening member 3A of the thin-flm loosening unit 3, by which the cover film 1D can be loosened from the photosensitive resin layer 1C to produce a gap therebetween. The fluid is ejected into the gap by the fluid spraying unit 4, by which the cover film 1D can be released as shown in FIG. 9 (in which the reference numeral 1d represents the cover film after releasing).

The loosening of the end portion of the cover film 1D can be operated by the loosening member 3A which is shaped like a needle and simple in construction. Because the thin-film loosening unit 3 and the fluid spraying unit 4 are installed in the substrate conveyance path A—A of the printed-wiring substrate, the loosening operation and releasing operation of the end portion of the cover film can be done automatically.

In this embodiment, a plurality of loosening members 3A and a plurality of nozzles 4A may be provided in the direction (widthwise direction) intersecting the substrate conveyance direction of the printed-wiring substrate 1, in consideration of the thermocompression lamination distorted with respect to the printed-wiring substrate 1.

Although this embodiment has shown the case where the loosening members 3A of the thin-film loosening unit 3 are arranged in the direction (widthwise direction) intersecting the substrate conveyance direction of the printed-wiring substrate 1, it is to be understood that the invention is not limited to the specific embodiment but, for example, applicable to the case where the loosening members 3A may be arranged in the same direction as the substrate conveyance direction of the printed-wiring substrate 1 and in the vicinity of the end portion or corner portion of the lamination. In this case, the nozzles 4A of the fluid spraying unit 4 are arranged in the vicinity of the loosening members 3A.

Although this embodiment has shown the case where the loosening members 3A of the thin-film loosening unit 3 are operated by a link mechanism, the invention is applicable to the case where the loosening members 3A may be operated by a rack-and-pinion mechanism.

The invention is also applicable to the case where the loosening members 3A of the thin-film loosening unit 3 may be formed of a tack member, such as tack roller or the like, or a projecting member, such as needle, brush, hook or the like.

Figure 10:
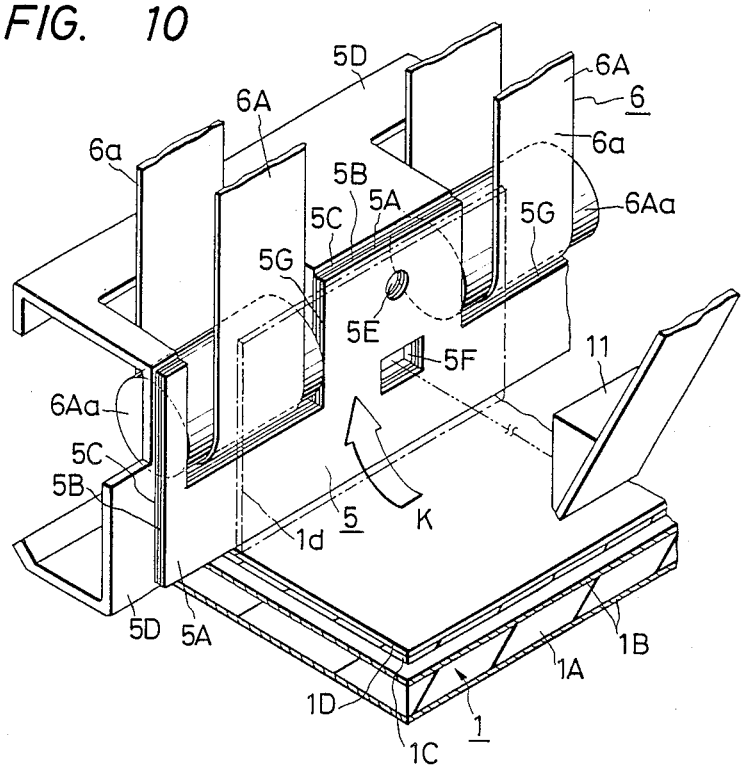
FIG. 10 is a perspective view of a main part of FIG. 2.

The substrate-conveyance-direction forward side of the cover film 1d which has been released by the fluid spraying unit 4 is attached on the releasing-direction setting plate (releasing auxiliary plate) 5 by the fluid pressure from the fluid spraying unit 4 as shown in FIGS. 2 and 10 (partly perspective view). The releasing-direction setting plate 5 is provided to limit the releasing position and releasing angle of the cover film 1D and set the conveyance direction when the released cover film 1d is conveyed or exhausted by the thin-film conveyer 6. As shown in FIG. 10, the released cover film 1d is shown by the dot-and-dash line.

The thin-film adhesion surface (the surface of adhesion of the cover film 1d) of the releasing-direction setting plate 5 is not limited to the specific embodiment as long as the cover film 1D stuck to the printed-wiring substrate 1 make about right angles. In other words, the releasing-direction setting plate 5 is provided to release the cover film 1d perpendicularly to the surface of the printed-wiring substrate 1.

In order to avoid damage and destruction of the photosensitive resin layer 1C, the releasing-side forward end (releasing position) of the releasing-direction setting plate 5 is shaped like an arc with a small radius of curvature which, for example, is not larger than 3 mm.

In order to avoid damage and destruction of the photosensitive resin layer 1C, the releasing-direction setting plate 5 is arranged at a distance from the cover film 1D stuck to the printed-wiring substrate 1 so as not to be in contact with the cover film 1D at the time of conveyance of the printed-wiring substrate 1 and at the time of releasing of the cover film 1D during conveyance thereof. The top end of the releasing-direction setting plate 5 is arranged so as to be brought into close contact with the cover film to hold the printed-wiring substrate 1 at the time of loosening and releasing of the end portion of the lamination. In other words, the releasing-direction setting plate 5 is arranged so as to be movable close to or far away from the substrate conveyance path A—A and so that, when the releasing-direction setting plate 5 is moved near to the path A—A, the printed-wiring substrate 1 is held by its bottom. As shown in FIG. 2, the releasing-direction setting plate 5 is operated with the braking push plate 2C (operated by the pneumatic cylinder) for pressing the substrate push rollers 2A, so that the releasing-direction setting plate 5 is moved close to or away from the printed-wiring substrate 1. The releasing-direction setting plate 5 is arranged to nip the printed-wiring substrate 1 when the printed-wiring substrate 1 is nipped by the substrate push rollers 2A.

As described above, the releasing-direction setting plate 5 is arranged to be moved close to or far from the substrate conveyance path A—A to thereby prevent the fluid from flowing out from the nozzles 4A of the fluid spraying unit 4 to the rear side of the releasing-direction setting plate 5. Therefore, the effect of releasing the cover film 1D can be improved and the force of adhesion and maintenance of the cover film 1d to the releasing-direction setting plate 5 and conveyance belt (6) can also be improved.

The releasing-direction setting plate 5 is arranged to have a predetermined length in the direction of releasing so that the entire area corresponding to the width of the substrate conveyance path A—A or corresponding to the fluid spray width can be covered.

According to the aforementioned releasing-direction setting plate 5, the fluid can be prevented from flowing out to its rear side as shown in FIG. 10 in which the arrow K represents the direction of flowing-out of the fluid from the nozzle 4A. Accordingly, the effect of releasing the cover film 1D can be improved and the adhesion force and maintenance of the cover film 1d to the releasing-direction setting plate 5 and conveyance belt (6) can be improved.

An electrically conductive member 5A as shown in detail in FIG. 10 is provided at the thin-film adhesion surface (where the cover film 1d is directly attached) of the releasing-direction setting plate 5. The electrically conductive member 5A is provided on an electrically insulating member 5B. The electrically conductive member 5A is fixed, through the electrically insulating member 5B and an electrically conductive member 5C, to a U-shaped setting plate supporting member 5D of the releasing-direction setting plate 5 by adhesive agents.

Each of the electrically conductive members 5A and 5C is formed like a plate out of a metal material having a very small value of electrical resistance, such as for example copper, stainless steel or the like. The insulating member 5B is also formed like a plate. The setting plate supporting member 5D is formed of a metal material, such as for example stainless steel or the like. The electrically conductive member 5A is provided in an electrically loosening state.

As described above, the electrically conductive member 5A constituting the thin-film adhesion surface of the releasing-direction setting plate 5 is provided on the electrically insulating member (insulator) 5B, by which, when the cover film 1d released from the printed-wiring substrate 1 is attached on the electrically conductive member 5A, Coulomb force due to capacitance acts, so that the force of adhesion and maintenance of the cover film 1d can be improved more. In other words, the electrically conductive member 5A is provided so that the cover film 1d can be securely attached on the thin-film adhesion surface of the releasing-direction setting plate 5 and can be maintained thereon.

As another method, for example, the setting plate supporting member 5D of the releasing-direction setting plate 5 may be formed of an insulating material, such as resin or the like, to provide the electrically conductive member 5A directly on the thin-film adhesion surface of the releasing-direction setting plate 5, as long as the electrically conductive member 5A can be arranged on an insulator so as to be kept in an electrically loosening (neutral) state. The electrically conductive member 5A serves as one electrode of a capacitor.

Figure 11:
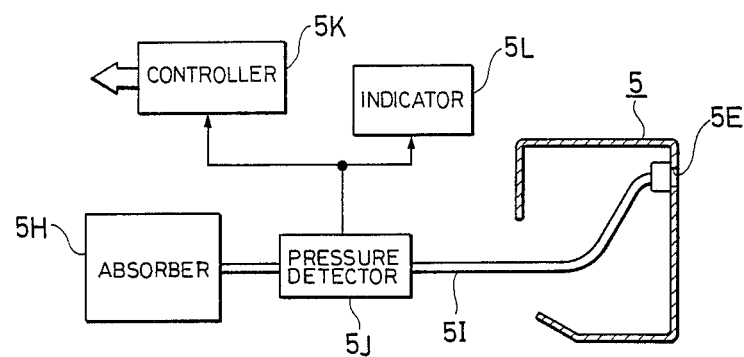
FIG. 11 is a block diagram of the thin-film releasing state detector depicted in FIG. 10.
Figure 13:
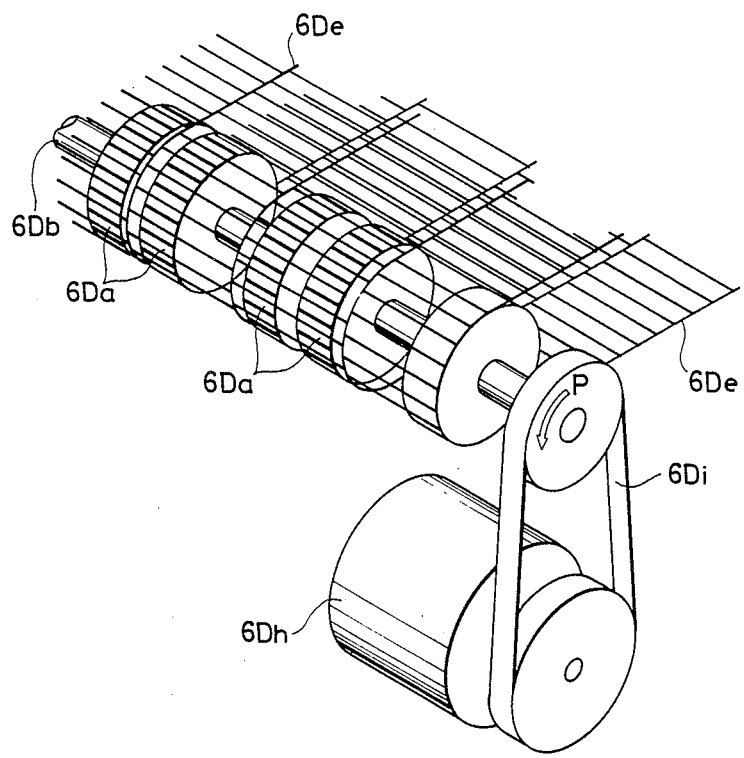
FIG. 13 is an enlarged perspective view of a main part of FIG. 12.

A thin-film adsorption hole 5E piercing the electrically insulating member 5B, the electrically conductive member 5C and the setting plate supporting member 5D is provided at the thin-film adhesion surface of the releasing-direction setting plate 5. As shown in FIG. 11 (block diagram), an adsorption system (vacuum adsorption system) 5H is connected to the thin-film adsorption hole 5E through an adsorption pipe 5I. Attraction force from the adsorption system 5H through the adsorption pipe 5I acts on the thin-film adsorption hole 5E. The cover film 1d is positively absorbed to the thin-film adhesion surface of the releasing-direction setting plate 5 by the attraction force so that the state of the cover film 1d is kept constant. One thin-film adsorption hole 5E may be provided in the thin-film adhesion surface or a plurality of thin-film adsorption holes 5E may be provided in order to improve the force of adsorption and maintenance of the cover film 1d more.

As described above, the thin-film adsorption hole 5E is provided in the thin-film adhesion surface of the releasing-direction setting plate 5 and is connected to the adsorption system 5H, by which the cover film 1d can be securely attached and maintained on the thin-film adhesion surface. Accordingly, the cover film 1d can be securely nipped by conveyance belts of the thin-film conveyer 6 which will be described in detail. Accordingly, the conveyance (exhaust) of the printed-wiring substrate 1 can be made securely during the releasing operation of the cover film 1D stuck thereto. Accordingly, the thin-film adsorption hole 5E and the adsorption system 5H are provided to avoid the trouble that the cover film 1D cannot be released sufficiently though the thin-film releasing process has been carried out. In other words, they are provided to prevent the production of substrates bad in thin-film releasing.

As shown in FIG. 11, an adsorption pressure detector 5J for detecting adsorption pressure (vacuum pressure) is provided in a connection path between the thin-film adsorption hole 5E and the adsorption system 5H, or in other words, provided in a predetermined position of the adsorption pipe 5I. For example, the adsorption pressure detector 5J may be formed by an elastic body method, such as a diaphragm type, a bellows type or the like. However, the detector 5J is not limited to the specific embodiment. The adsorption pressure detector 5J is provided to judge whether the released cover film 1d is attached on the thin-film adhesion surface of the releasing-direction setting plate 5 or not. In other words, the adsorption pressure detector 5J is provided to detect the state of releasing. When the adsorption pressure is high, the adsorption pressure detector 5J generates a detection signal to express to fact that the cover film 1d is securely attached on the thin-film adhesion surface. Otherwise, the detector 5J generates a negative detection signal. These detection signals are converted into electrical signals by a pneumatic or differential transformer and then are sent to a control circuit 5K or a display unit 5L. Alternatively, the detection signals may be mechanically relayed to the control circuit 5K or the display unit 5L through a link mechanism. The adsorption pressure detector 5J and the control circuit 5K (or the display unit 5L) constitute a thin-film state detecting unit. As shown in FIG. 1, the control circuit 5K is arranged in the central portion of the thin-film releasing apparatus body. As shown in FIG. 1, the display unit 5L is provided in the upper portion of the thin-film releasing apparatus body for the purpose of confirmation by human operators.

The control circuit 5K is constructed so that the control of rotation of the conveyance driving rollers 2 and the control of releasing operation are carried out by reference to the output signal of the adsorption pressure detector 5J. When, for example, the detection signal showing the fact that the cover film 1d is not released is received from the adsorption pressure detector 5J, the control circuit 5K is operated to stop the operation of the thin-film conveyer 6 and convey the defected separation substrate to a predetermined position (defected substrate removing unit) through the conveyance driving rollers 2 so that the defective substrate can be removed. In other words, the control circuit 5K is provided to remove the defected separation substrate from the substrate conveyance path A—A so that the defected substrate is not conveyed to a development apparatus in the next stage.

The display unit 5L is constituted by a sound generator, such as a buzzer or the like, or a light generator, such as a lamp or the like. The display unit 5L which has a function similar to that of the control circuit 5K, is provided to inform the human operators to remove the defected separation substrate from the substrate conveyance path A—A so that the defected substrate is not conveyed to the development apparatus in the next stage.

In order to improve accuracy of detection of the releasing state of the cover film 1d, it is preferable that a plurality of thin-film adsorption holes 5E are provided in the thin-film adhesion surface of the releasing-direction setting plate 5 and that a plurality of thin-film releasing state detectors are provided corresponding to the thin-film adsorption holes 5E.

As described above, the thin-film releasing state detector is provided between the thin-film adsorption hole 5E and the adsorption system 5H, by which some substrates defective in thin-film releasing can be detected on the basis of judgment as to whether the cover film 1d is released or not. Accordingly, the defected separation substrate can be removed from the substrate conveyance path A—A so that the defected substrate is not conveyed to the next-stage development apparatus. Accordingly, the defected substrate can be recovered, so that the yield of printed-wiring substrates 1 can be improved.

Further, as shown in FIG. 10, a thin-film releasing state detection hole 5F piercing the releasing-direction setting plate 5 in the same manner as the thin-film adsorption hole 5E is provided in the thin-film adhesion surface of the releasing-direction setting plate 5. The thin-film releasing state detection hole 5F is formed to transmit liquid radiated from a photosensor 11 to thereby judge whether the cover film 1d is attached on the thin-film adhesion surface of the releasing-direction setting plate 5 or not, or in other words, to thereby detect the releasing state. The photosensor is constructed so that, when the thin-film releasing state detection hole 5F is blocked by the cover film 1d, light reflected by the cover film 1d can be detected. When the adhesion of the cover film 1d on the thin-film adhesion surface cannot be confirmed by the thin-film releasing state detection hole 5F and the photosensor 11, the printed-wiring substrate 1 (defective in thin-film releasing) is removed from the substrate conveyance path A—A in the same manner as described above. The photosensor 11 which is of a reflection type (or a transmission type) is mounted to the apparatus body 7 as shown in FIG. 3.

According to the aforementioned releasing-direction setting plate 5, uniform releasing force can be applied to the cover film 1D at the releasing position of the cover film 1D being stabilized. Accordingly, the releasing-direction setting plate 5 prevents the change of the releasing position and the unbalance of releasing stress at the time of releasing of the cover film 1D to thereby prevent damage and destruction of the photosensitive resin layer 1C.

The thin-film adhesion surface of the releasing-direction setting place 5 may be constructed so that the cover film 1D and the released cover film 1d make an obtuse angle corresponding to the change of conditions, such as the material of the cover film 1D, the fluid pressure of the fluid spraying unit 4, the speed of conveyance of the printed-wiring substrate 1, and the like. The angle of the thin-film adhesion surface of the releasing-direction setting plate 5 may be changed by a driving source, such as a pneumatic cylinder or the like. Further, the positions and angles of the stationary and movable conveyance belts of the thin-film conveyer 6 may be changed corresponding to the angle change of the releasing-direction setting plate 5.

Further, the invention may be constructed as follows: A plurality of grooves extending in the direction intersecting the substrate conveyance direction or in the direction of releasing of the cover film 1d may be provided in the thin-film adhesion surface of the releasing-direction setting plate 5; a plurality of thin-film adsorption holes 5E may be provided in the thin-film adhesion surface and the groove-bottom surface; and the respective thin-film adsorption holes 5E may be connected to the adsorption system. According to the releasing-direction setting plate 5 constructed as described above, not only the cover film 1d can be securely attached on the thin-film adhesion surface, but also the cover film 1d can be instantaneously removed from the thin-film adhesion surface when the cover film 1d is to be conveyed (exhausted) to the thin-film conveyer 6 after the adhesion of the cover film 1d. Consequently, the cover film 1d can be securely conveyed by the thin-film conveyer 6.

Figure 12:
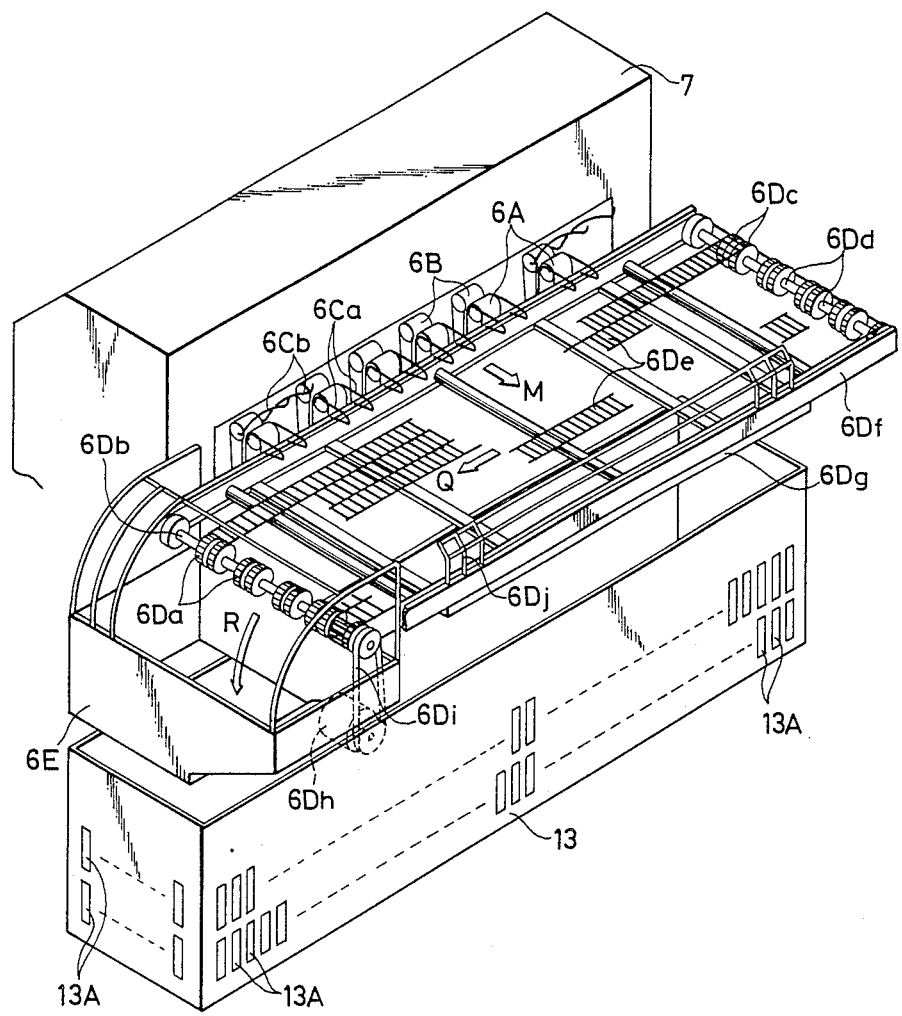
FIG. 12 is a schematic perspective view of main part of the thin-film conveyance system depicted in FIG. 1.

The cover film 1d attached on the thin-film adhesion surface of the releasing-direction setting plate 5 by the fluid spraying unit 4 is released and conveyed by the thin-film conveyer (thin-film exhaust unit) 6 as shown in FIGS. 1, 2 and 12 (partly perspective view), so that the cover film 1d is exhausted. In this condition, the releasing-direction setting plate 5 is arranged to determine the releasing position of the cover film 1D and assist the releasing of the cover film 1D.

As shown in FIG. 2, the thin-film conveyer 6 is constituted by an upper thin-film conveyer (upper conveyance belt mechanism) arranged on the upper side of the conveyance path A—A of the printed-wiring substrate 1, and a lower thin-film conveyer (lower conveyance belt mechanism) arranged on the lower side thereof. The upper thin-film conveyer is constituted by a first thin-film conveyance system (6A and 6B) and a second thin-film conveyance system (6D).

As shown in FIG. 2, the first thin-film conveyance system of the upper thin-film conveyer is constituted by a stationary conveyance belt (stationary belt conveyer) 6A and a movable conveyance belt (movable belt conveyer) 6B.

The movable conveyance belt 6A is constituted by a roller 6Aa supported by a follower shaft, a roller 6Ab supported by a follower shaft, a roller 6Ac supported by a driving shaft, and a belt 6a wound on the rollers 6Aa, 6Ab and 6Ac.

The movable conveyance belt 6B is constituted by a roller 6Ba supported by a follower shaft, a roller 6Bb supported by a follower shaft, a roller 6Bc supported by a driving shaft, and a belt 6b wound on the rollers 6Ba, 6Bb, and 6Bc. The movable conveyance belt 6B is constructed so that the roller 6Ba can rotate in the direction of the arrow L as shown in FIG. 2 around the follower shaft supporting the roller 6Bb. The movable conveyance belt 6B is provided to assist the adhesion of the released cover film 1d on the releasing-direction setting plate 5 and nip the cover film 1d between the stationary conveyance belt 6A and itself. When the cover film 1d attached on the thin-film adhesion surface of the releasing-direction setting plate 5 is nipped between the belt 6a of the stationary conveyance belt 6A and the belt 6b of the movable conveyance belt 6B, the cover film 1d is conveyed upward while nipped. Consequently, the cover film 1d is conveyed by the stationary conveyance belt 6A and the movable conveyance belt 6B while released from the surface of the printed-wiring substrate 1.

The nipping operation between the stationary conveyance belt 6A and the movable conveyance belt bB are carried out through cutaway portions 5G provided in the releasing-direction setting plate 5 as shown in FIG. 10. The cutaway portions 5G are constructed so that the stationary conveyance belt 6A and the movable conveyance belt 6B can reach to the cover film 1d after the releasing position, releasing angle and releasing direction are set by the releasing-direction setting plate 5, and that the cover film 1d can be nipped between the two belts. In short, the cutaway portions 5G are constructed so that the cover film 1d can be securely nipped between the stationary conveyance belt 6A and the movable conveyance belt 6B.

The cover film 1d conveyed while nipped between the stationary conveyance belt 6A and the movable conveyance belt 6B in the first thin-film conveyance system is guided in the direction of the array M by guide members 6Ca and 6Cb and conveyed to the second thin-film conveyance system.

Each of the guide members 6Ca and 6Cb is arranged to change the conveyance direction of the cover film 1d from a vertical direction to a horizontal direction. Each of the guide members 6Ca and 6Cb is constituted by a rod-like member to make the contact area with the cover film 1d as small as possible. The guide members 6Ca and 6Cb are arranged in a plurality of places in the direction intersecting the conveyance path A—A of the printed-wiring substrate 1. Each of the guide members 6Ca and 6Cb is formed of an electrically conductive material, such as stainless steel or the like. The guide members 6Ca and 6Cb formed of an electrically conductive material are constructed so that electrostatic energy generated from the cover film 1d during the releasing or conveyance thereof can be discharged. Alternatively, each of the guide members 6Ca and 6Cb may be formed of an insulating material, such as resin or the like.

Each of the guide members 6Ca and 6b is arranged to prevent the cover film 1d from revolving in the roller 6Ac of the stationary conveyance belt 6A or the roller 6Bc of the movable conveyance belt when the cover film 1d is conveyed from the first thin-film conveyance system to the second thin-film conveyance system.

Fluid jetting units 12 and static eliminator units 15 are provided in the vicinity of the guide members 6Ca and 6Cb, respectively. One of the fluid jetting units 12 arranged in the vicinity of the guide member 6Ca is constructed to jet the fluid in the direction of the arrow N. The other fluid jetting unit 12 arranged in the vicinity of the guide member 6Cb is constructed to jet the fluid in the direction of the arrow O. These fluid jetting units 12 are constructed so that the fluid is fed to the opposite sides of the cover film 1d conveyed by the first thin-film conveyance system to thereby convey the cover film 1d smoothly to the second thin-film conveyance system. Further, the fluid jetting units 12 are arranged to prevent the cover film 1d from revolving in the roller 6Ac of the stationary conveyance belt 6A or the roller 6Bc of the movable conveyance belt when the cover film 1d is conveyed from the first thin-film conveyance system to the second thin-film conveyance system.

The static eliminator units 15 are arranged to reduce electrostatic energy generated on the cover film 1d during the releasing or conveyance thereof.

The cover film 1d conveyed by the first thin-film conveyance system is conveyed to the second thin-film conveyance system as shown in FIGS. 1, 2, 12 and 13 (partly enlarged perspective view through FIG. 2) and then conveyed or exhausted by the second thin-film conveyance system. The second thin-film conveyance system (6D) is constituted by rollers 6Da, a driving shaft 6Db, follower rollers 6Dc, a follower shaft 6Dd, a conveyance belt 6De, a frame 6Df, a support 6Dg, and a driving motor 6Dh.

The driving rollers 6Da are mounted to the driving shaft 6Db. The driving rollers 6Da are linked to the driving motor 6Dh through the driving shaft 6D and a transmission belt 6Di, so that the driving rollers 6Da can be rotated in the direction of the arrow P by the driving motor 6Dh. Each of the driving rollers 6Da is formed as a gear or sprocket having teeth arranged at regular intervals in its outside. Each of the driving rollers 6Da is formed of an electrically conductive material, such as steel, stainless steel, conductive resin or the like. The driving rollers 6Da are arranged at a plurality of positions along the driving shaft 6Db and supported through the driving shaft 6Db by the frame 6Df at opposite ends thereof.

The follower rollers 6Dc are mounted on the follower shaft 6Dd. The follower rollers 6Dc are constructed so that the rotational force of the driving rollers 6Da can be transmitted through the conveyance belt 6De. Each of the follower rollers 6Dc is formed substantially as a rotary body having no teeth at its outside. The follower rollers 6Dc are formed of the same material as that of the driving rollers 6Da. The follower rollers 6Dc are arranged at a plurality of positions along the follower shaft 6Dd and supported through the follower shaft 6Dd by the frame 6Df at opposite ends thereof.

The conveyance belt 6De is wound on the driving rollers 6Da and the follower rollers 6Dc. As shown in FIG. 12, the conveyance belt 6De is constructed so that the cover film 1d conveyed in the direction of the arrow M by the first thin-film conveyance system is conveyed in the direction of the arrow Q intersecting the conveyance direction A (or conveyance path A—A) of the printed-wiring substrate 1. The conveyance belt 6De is arranged to carry the cover film 1d conveyed by the first thin-film conveyance system and convey the cover film 1d substantially horizontally.

The conveyance belt 6De is formed of an electrically conductive material, such as stainless steel, copper, conductive resin or the like. The conveyance belt 6De is formed mesh-like by knitting the electrically conductive material provided linearly. The mesh size of the conveyance belt 6De can be selected suitably as long as the cover film 1d can be carried or conveyed thereon.

The frame 6Df is attached to the thin-film releasing apparatus body 7 through the support 6Dg. Each of the frame 6Df and the support 6Dg is formed of an electrically conductive material, such as stainless steel or the like.

A stopper member 6Dj is provided opposite to the guide members 6Ca and 6Cb with respect to the conveyance belt 6De. The stopper member 6Dj is constructed so that the cover film 1d conveyed in the direction of the arrow M from the first thin-film conveyance system can be securely carried on the conveyance belt 6De. The stopper member 6Dj is attached to the frame 6Df.

The second thin-film conveyance system is arranged in the upper portion of the conveyance path A—A of the printed-wiring substrate 1 in the stage preceding the releasing position (the position of the releasing-direction setting plate 5) of the cover film 1D of the printed-wiring substrate 1. In other words, the second thin-film conveyance system is arranged in such a position that impurities attached on the released cover film 1d and impurities from the second thin-film conveyance system can be prevented from being attached on the photosensitive resin layer 1C of the printed-wiring substrate 1. Because the thin-film loosening unit 3, the fluid spraying unit 4, a defective substrate removing unit 18 (which will be described later) and the like are provided in the stage succeeding the releasing position of the cover film 1D, the second thin-film conveyance system is arranged in the stage preceding the releasing position as described above in order to improve workability in maintenance thereof.

The cover film 1d conveyed in the direction of the arrow Q by the conveyance belt 6De of the second thin-film conveyance system is conveyed in the direction of the arrow R through an exhaust guide member 6E provided at a side of the conveyance path A—A of the printed-wiring substrate 1. The cover film 1d thus conveyed is exhausted to an exhausted thin-film receiving vessel 13 which slightly projects in the direction intersecting the conveyance path A—A. The exhaust guide member 6E is arranged to limit the conveyance path of the cover film 1d so that the cover film 1d can be exhausted down to the exhausted thin-film receiving vessel 13 in as narrow space as possible. The material for the exhaust guide member 6E may be selected suitably. In this embodiment, the exhaust guide member 6E is formed of stainless steel.

The exhausted thin-film receiving vessel 13 is formed as a rectangular parallelepiped which is short in the same direction as the conveyance path A—A of the printed-wiring substrate, long in the direction intersecting the conveyance path A—A, and lower than the height (for example, about 1m above the ground) of the conveyance path A—A of the printed-wiring substrate 1. The exhausted thin-film receiving vessel 13 is constructed as if an exhausted thin-film receiving vessel for receiving the other cover film 1d conveyed by the lower thin-film conveyer (third thin-film conveyance system) was slightly enlarged by the size corresponding to the exhaust guide member 6E. In other words, the exhausted thin-film receiving vessel 13 serves as an exhausted thin-film receiving vessel for receiving the cover film 1d conveyed by the upper thin-film conveyer and as an exhausted thin-film receiving vessel for receiving the cover film 1d conveyed by the lower thin-film conveyer.

The material for the exhausted thin-film receiving vessel 13 is selected from light metal materials, an such as aluminum alloy and the like, metal materials, such as stainless steel and the like, resin materials, wood materials and the like. A plurality of rectangularly shaped air vents 13A are provided in side surfaces of the exhausted thin-film receiving vessel 13 in order to draw out the air existing in the lower portion of the cover film 1d (the air existing within the exhausted thin-film receiving vessel 13) when the cover film 1d is exhausted. Alternatively, the air vents 13A may be shaped circularly.

As shown in FIG. 2, the lower thin-film conveyer is constituted by a stationary conveyance belt 6F and a movable conveyance belt 6g.

The stationary conveyance belt 6F is constituted by rollers 6Fa and 6Fb respectively supported by different follower shafts, a rollers 6Fc supported by a driving shaft, and a belt 6f wound on the rollers 6Fa–6Fc.

The movable conveyance belt 6G is constituted by rollers 6Ga and 6Gc respectively supported by different follower shafts, a roller 6Gb supported by a driving shaft, and a belt 6g wound on the rollers 6Ga–6Gc. The movable conveyance belt 6G is arranged to be rotated in the direction of the arrow L in the same manner as the movable conveyance belt 6B.

Substantially similar to the first thin-film conveyance system of the upper thin-film conveyer, the lower thin-film conveyer is constructed so that the other cover film 1d of the printed-wiring substrate 1 in which the setting of the releasing position and releasing direction has been made by the releasing-direction setting plate 5 is conveyed with separation thereof to thereby exhaust the cover film 1d downward (in the direction of the arrow S).

The belts 6a and 6b constituting the upper thin-film conveyer and the belts 6f and 6g constituting the lower thin-film conveyer are respectively formed as rubber belts having teeth. The rollers 6Aa, 6Ab, 6Ac, 6Ba, 6Bb, 6Bc, 6Fa, 6Fb, 6Fc, 6Ga, 6Gb and 6Gc are respectively formed as pulleys having teeth. In short, these rollers are formed so as to secure the running of the belts. Although this embodiment has shown the case where the belts and rollers are respectively formed as rubber belts having teeth and as pulleys having teeth, the invention is applicable to the case where the belts and rollers are respectively formed as rough-surface rubber belts having a large coefficient of friction and as rough-surface rollers having a net knurled pattern.

As shown in FIG. 2, fluid jetting units 12 for blowing out fluid to the cover film 1d in the exhausting direction are provided in the vicinity of the thin-film conveyance path in the exhaust portions of the stationary conveyance belt 6F and the movable conveyance belt 6G, respectively. The fluid jetting units 12 are constructed so that the cover film 1d to be exhausted can be securely guided by fluid injection. Each of the fluid jetting units 12 is formed as a pipe having a nozzle for jetting the fluid. Gas, such as compressed air, inert gas or the like, may be used as the fluid. Alternatively, liquid, such as water or the like, may be used as the fluid.

As shown in FIG. 2, the static eliminator units 15 and ion diffusion units 16 are provided in the vicinity of the stationary conveyance belt 6A and in the vicinity of the movable conveyance belt 6G, respectively. The static eliminator units 15 are constructed so as to release ions to thereby reduce electrification of the cover film 1 during releasing and conveyance. The ion diffusion units 16 are constructed so as to diffuse the ions released from the static eliminator units 15 to thereby reduce electrification of the cover film 1d efficiently. The ion diffusion units 16 are provided to diffuse ions with fluid, such as compressed air or the like.

As described above, the thin-film releasing apparatus in which a portion of a cover film 1D is released from a surface of a printed-wiring substrate 1 on which the cover film 1D is stuck, the remaining portion of the cover film 1D is then released starting from the released portion thereof, and the released cover film 1d is then drawn off, is characterized in that the apparatus comprises a first thin-film conveyance system (6A and 6B) for releasing the entire cover film 1D from the printed-wiring substrate 1 by nipping the cover film 1d at the initially released portion thereof and for conveying the released cover film 1d upward from the surface of the printed-wiring substrate 1 while nipping the thin film, and a second thin-film conveyance system (6D) for mounting thereon the cover film 1d conveyed by the first thin-film conveyance system and for conveying the mounted thin film in a direction intersecting a conveyance path A—A of the printed-wiring substrate 1. Accordingly, the length for conveyance of the nipped cover film 1d (the length of the first thin-film conveyance system) can be shortened by a degree corresponding to the second thin-film conveyance system, so that conveyance problems such as jamming of the cover film 1d can be reduced in the exhaust path of the cover film 1d.

Further, in addition to the above-mentioned arrangement, there is provided a second thin-film conveyance system having an electrically conductive belt 6De for mounting thereon the cover film 1d conveyed by the first thin-film conveyance system and for conveying the mounted cover film 1d in a direction intersecting the conveyance path A—A of the printed-wiring substrate 1. Accordingly, not only the same effect as described above can be attained but also, because electrostatic energy produced during releasing of the cover film 1D from the printed-wiring substrate 1 and during conveyance of the cover film 1d by the first thin-film conveyance system can be discharged through the electrically conductive conveyance belt 6De, conveyance problems of the cover film 1d caused by the occurrence of the electrostatic energy in the conveyance path of the cover film 1d can be reduced.

Further, the second thin-film conveyance system having the mesh-like conveyance belt 6De is provided at a position above the conveyance path A—A of the printed-wiring substrate 1. Accordingly, the conveyance state of the printed-wiring substrate 1 can be checked by human operators.

Further, because the conveyance belt 6De of the second thin-film conveyance system is formed mesh-like, fluid jetting units 12 can be provided to inject fluid outward from the area surrounded by the conveyance belt 6De.

Further, in addition to the above arrangement, the second thin-film conveyance system is provided at a position above the conveyance path A—A of the printed-wiring substrate 1 in a stage preceding the position of releasing of the cover film 1D. Accordingly, not only the same effect as described above can be attained but also impurities attached on the released cover film 1d and impurities from the second thin-film conveyance system can be prevented from being deposited on the light-sensitive resin layer 1C of the printed-wiring substrate 1 after the cover film 1D has been released therefrom, so that the yield of printed-wiring substrates 1 in manufacturing process can be improved.

Further, the thin-film releasing apparatus in which a portion of a cover film 1D is released from a surface of a printed wiring substrate 1 on which the cover film 1D is stuck, the remaining portion of the cover film 1D is then released starting from the released portion thereof, and the released cover film 1d is then drawn off into exhausted thin-film receiving vessels, is characterized in that the apparatus comprises a first thin-film conveyance system (6A and 6B) for releasing the entire cover film 1D from the printed-wiring substrate 1 by nipping the cover film 1d at the initially released portion thereof and for conveying the released cover film 1d upward from the surface of the printed-wiring substrate 1 while nipping the thin film, and a second thin-film conveyance system (6D) for mounting thereon the cover film 1d conveyed by the first thin-film conveyance system and for conveying the mounted thin film in a direction intersecting a conveyance path A—A of the printed-wiring substrate 1, the exhausted thin-film receiving vessel 13 for receiving the cover film 1d conveyed by the second thin-film conveyance system being provided at a side of the conveyance path A—A of the printed-wiring substrate 1. Accordingly, not only the same effect as described above can be attained but also because the exhausted thin-film receiving vessel 13 is arranged at a relatively lower position in a side of the conveyance path A—A of the printed-wiring substrate 1, workability in handling of the exhausted thin-film receiving vessel 13 can be improved in work, such as disposal of the waste cover film 1d and the like.

Further, the thin-film releasing apparatus in which portions of first and second cover films 1D stuck on opposite surfaces of a printed-wiring substrate 1 are released from the surfaces, the remaining portions of the first and second cover films 1D are then released starting from the released portions thereof, and the released first and second cover films 1d are then drawn off into exhausted thin-film receiving vessels, is characterized in that the apparatus comprises a first thin-film conveyance system (6A and 6B) for releasing the entire first cover film 1D by nipping the first cover film at the initially released portion thereof and for conveying the released first cover film 1d upward from an upper one of the opposite surfaces of the printed-wiring substrate 1 while nipping the first thin film, a second thin-film conveyance system (6D) for mounting thereon the first cover film conveyed by the first thin-film conveyance system and for conveying the mounted first cover film 1d in a direction intersecting a conveyance path of the printed-wiring substrate 1, a first one of the exhausted thin-film receiving vessels 13 being provided at a side of the conveyance path A—A of the printed-wiring substrate 1 so as to receive the first cover film 1d conveyed by the second thin-film conveyance system, a lower thin-film conveyance system (a third thin-film conveyance system 6F and 6G) for releasing the whole of the second cover film 1D by nipping the second cover film 1d at the initially released portion thereof and for conveying the released second cover film 1d downward from a lower one of the opposite surfaces of the printed-wiring substrate while nipping the second thin film 1d, and a second one of the exhausted thin-film receiving vessels 13 provided for receiving the second cover film 1d conveyed by the third thin-film conveyance system, the second exhausted thin-film receiving vessel 13 being provided integrally with (common to) the first exhausted thin-film receiving vessel at a portion below the conveyance path A—A of the printed-wiring substrate 1. Accordingly, not only the same effect as described above can be attained but also because the size of the exhausted thin-film receiving vessel 13 can be reduced, miniaturization of the thin-film releasing apparatus can be attained.

In the conveyance path A—A of the printed-wiring substrate 1 as shown in FIG. 1, centering means 17 for making the respective widthwise center positions of the printed-wiring substrate 1 and the conveyance path A—A coincide with each other are provided in a stage preceding the position of releasing the cover film 1D of the printed-wiring substrate 1. Further, in the conveyance path A—A, defective substrate removing means 18 for removing defected separation substrates from the conveyance path A—A are provided in the stage succeeding the position of releasing of the cover film 1D of the printed-wiring substrate 1. The defective substrate removing means 18 are constructed so that defected separation substrates are removed from the conveyance path A—A in the direction of the arrow T to the exhaust portion 18A.

Having described the present invention as related to the specific embodiment, it is a matter of course that the invention is not limited to the specific embodiment and that various changes and modifications may be made without departing from the spirit and scope thereof.

For example, the conveyance belt 6De in the second conveyance system (6D) of the thin-film conveyer 6 may be formed of an electrically insulating material, such as rubber or the like.

Further, the conveyance belt 6De is not required to be formed in a meshed shape.

For example, the invention is applicable to an apparatus for releasing protective film stuck to a smoothly planed board as a building material.

As described above, according to the present invention, the following improvements can be attained; elimination of conveyance problems of the thin film; the yield of substrates in manufacturing process; ability to maintain the exhausted thin-film receiving vessel for exhausting the thin film; and miniaturization of the thin-film releasing apparatus.

What is claimed is:

1. A thin-film releasing apparatus applicable to the manufacture of printed circuit boards by a process in which a substrate containing a thin film is conveyed in a conveyance direction and a portion of said thin film is released from a surface of said substrate on which said thin film is stuck, the remaining portion of said thin film is then released starting from said released portion thereof, and said released thin film is then removed, said apparatus comprising: a first thin-film conveyance system for releasing the remaining portion of said thin film from said substrate by nipping said thin film at said initially released portion thereof and for conveying said released thin film upward from said surface of said substrate while nipping said thin film, and a second thin-film conveyance system for mounting thereon said thin film conveyed by said first thin-film conveyance system and for conveying said mounted thin film in a direction intersecting said conveyance direction of said substrate, in a plane substantially parallel to said surface of said substrate.

2. A thin-film releasing apparatus according to claim 1, in which said first thin-film conveyance system is arranged to release and convey said thin film in a direction substantially vertically to said surface of said substrate.

3. A thin-film releasing apparatus according to claim 1 or 2, in which a guide member for changing the conveyance direction of said thin film is provided between said first thin-film conveyance system and said second thin-film conveyance system.

4. A thin-film releasing apparatus according to claim 3, in which said guide member is formed of a linear electrically conductive material.

5. A thin-film releasing apparatus according to claim 2, in which fluid spraying means are provided between said first and second thin-film conveyance systems so that said thin film is smoothly conveyed from said first thin-film conveyance system to said second thin-film conveyance system.

6. A thin-film releasing apparatus according to claim 1 in which static elimination means are provided between said first and second thin-film conveyance systems so that said thin film is smoothly conveyed from said first thin-film conveyance system to said second thin-film conveyance system.

7. A thin-film releasing apparatus in which a portion of a thin film is released from a surface of a substrate on which said thin film is stuck, the remaining portion of said thin film is then released starting from said released portion thereof, and said released thin film is then removed, said apparatus comprising: a first thin-film conveyance system for releasing the remaining portion of said thin film from said substrate by nipping said thin film at said initially released portion thereof and for conveying said released thin film upward from said surface of said substrate while nipping said thin film; and a second thin-film conveyance system having an electrically conductive belt and for mounting thereon said thin film conveyed by said first thin-film conveyance system and for conveying said mounted thin film in a direction intersecting a conveyance direction of said substrate.

8. A thin-film releasing apparatus according to claim 7, in which said electrically conductive belt of said second thin-film conveyance system is formed by knitting a material of linear stainless steel.

9. A thin-film releasing apparatus applicable to the manufacture of printed circuit boards by a process in which a substrate containing a thin film is conveyed in a conveyance direction and a portion of said thin film is released from a surface of said substrate on which said thin film is stuck, the remaining portion of said thin film is then released starting from said released portion thereof, and said released thin film is then removed, said apparatus comprising: a first thin-film conveyance system for releasing the remaining portion of said thin film from said substrate by nipping said thin film at said initially released portion thereof and for conveying said released thin film upward from said surface of said substrate while nipping said thin film; and a second thin-film conveyance system for mounting thereon said thin film conveyed by said first thin-film conveyance system and for conveying said mounted thin film in a direction intersecting a conveyance direction of said substrate, said second thin-film conveyance system being provided at a position above said substrate conveyance path in a stage preceding a position of releasing said thin film.

10. A thin-film releasing apparatus applicable to the manufacture of printed circuit boards by a process in which a substrate containing a thin film is conveyed in a conveyance direction and a portion of said thin film is released from a surface of said substrate on which said thin film is stuck, the remaining portion of said thin film is then released starting from said released portion thereof, and said released thin film is then drawn off into an exhausted thin-film receiving vessel, said apparatus comprising: a first thin-film conveyance system for releasing the remaining portion of said thin film by nipping said thin film at said initially released portion thereof and for conveying said released thin film upward from said surface of said substrate while nipping said thin film; and a second thin-film conveyed by said first thin-film conveyance system and for conveying said mounted thin film in a direction intersection said conveyance direction of said substrate in a plane substantially parallel to said surface of said substrate, said exhausted thin-film receiving vessel being provided at a side of said substrate conveyance path so as to receive said thin film conveyed by said second thin-film conveyance system.

11. A thin-film releasing apparatus in which portions of first and second thin films stuck on opposite surfaces of a substrate are released from opposite surfaces of a substrate are released from said surfaces, the remaining portions of said first and second thin films are then released starting from said released portions thereof, and said released first and second thin films are then drawn off into exhausted thin-film receiving vessels, said apparatus comprising: a first thin-film conveyance system for releasing the remaining portion of said first thin film by nipping said first thin film at said initially released portion thereof and for conveying said released first thin film upward from an upper one of said opposite surfaces of said substrate while nipping said first thin film; a second thin-film conveyance system for mounting thereon said first thin film conveyed by said first thin-film conveyance system and for conveying said mounted first thin film in a direction intersecting a conveyance direction of said substrate, in a plane substantially parallel to said surface of said substrate, a first one of said exhausted thin-film receiving vessels being provided at a side of said substrate conveyance path so as to receive said first thin film conveyed by said second thin-film conveyance system; a third thin-film conveyance system for releasing the remaining portion of said second thin film by nipping said second thin film at said initially released portion thereof and for conveying said released second thin film downward from a lower one of said opposite surfaces of said substrate while nipping said second thin film; and a second one of said receiving said second thin film conveyed by said third thin-film conveyance system, said second exhausted thin-film receiving vessel being provided integrally with said first exhausted thin-film receiving vessel at a position below said substrate conveyance path.

12. A thin film releasing apparatus according to claim 1 or 10 in which said first thin film conveyance system is disposed in a first position along said conveyance direction and said second thin film conveyance system is disposed in a second position along said conveyance direction, said second position being upstream of said first position.

* * * * *